US010681834B1

(12) United States Patent
Ni et al.

(10) Patent No.: US 10,681,834 B1
(45) Date of Patent: Jun. 9, 2020

(54) REMOVABLE CABLE ARM BRACKET

(71) Applicant: QUANTA COMPUTER INC., Taoyuan (TW)

(72) Inventors: Hsiao-Tsu Ni, Taoyuan (TW); Yaw-Tzorng Tsorng, Taoyuan (TW); Chun Chang, Taoyuan (TW); Cheng-Chieh Weng, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 0 days.

(21) Appl. No.: 16/549,709

(22) Filed: Aug. 23, 2019

Related U.S. Application Data

(60) Provisional application No. 62/824,021, filed on Mar. 26, 2019.

(51) Int. Cl.
*H05K 7/14* (2006.01)

(52) U.S. Cl.
CPC .................. *H05K 7/1491* (2013.01)

(58) Field of Classification Search
None
See application file for complete search history.

(56) References Cited

U.S. PATENT DOCUMENTS

| 8,607,993 | B2* | 12/2013 | Williams | A47B 88/00 |
| | | | | 211/26 |
| 2004/0056155 | A1* | 3/2004 | Chen | H02G 11/00 |
| | | | | 248/49 |
| 2009/0261213 | A1* | 10/2009 | Yu | H05K 7/1491 |
| | | | | 248/68.1 |
| 2017/0223864 | A1* | 8/2017 | Jost | H05K 7/1489 |

* cited by examiner

*Primary Examiner* — Xanthia C Cunningham
(74) *Attorney, Agent, or Firm* — Nixon Peabody LLP; Zhou Lu

(57) ABSTRACT

The present disclosure is directed to a removable cable arm bracket for attachment to an inner rail of a computer system. The cable arm bracket includes a spring sheet that can be biased for securing and removing the cable arm bracket from the inner rail. The spring sheet secures a projection from the inner rail within an aperture of the cable arm bracket to secure the cable arm bracket to the inner rail. Biasing of the spring sheet allows the projection to be removed from the aperture.

14 Claims, 8 Drawing Sheets

REMOVABLE CABLE ARM BRACKET

CROSS-REFERENCE TO RELATED APPLICATION

This application claims priority under 35 U.S.C. § 119 to U.S. Provisional Application No. 62/824,021, entitled "CABLE ARM LOCK WAY APPLICATION AT SERVER," and filed on Mar. 26, 2019. The contents of that application are hereby incorporated by reference in their entirety.

FIELD OF THE INVENTION

The present invention relates to cable management within computer systems and more specifically, to a removable cable guide.

BACKGROUND

Computer systems have many cables outside of the chassis. In particular, server computer systems having racks of many separate servers that have many different cables. Proper management of the cables is needed for improving airflow and overall design efficiency. Part of cable management involves routing the cables through the computer systems. Accordingly, computer systems have cable guides that are used to secure cables according to desired cable routing pathways so that the cables are not randomly routed throughout the computer systems.

FIG. 1 illustrates a conventional cable arm bracket 100 for routing cables within computer systems. The bracket 100 is fixed to a first end 102a of an inner rail 102. Because the bracket 100 is fixed to the inner rail 102, the bracket 100 cannot be removed. The inability to remove the bracket 100 can present issues, particularly for computer systems with less space for cable routing and connecting other components. Such issues can be inflexibility with respect to arrangement of elements in and around computer systems, added cost, etc.

For example, FIG. 2 illustrates a partial view of a computer system 200, where the bracket 100 interferes with the connection of a power supply latch 202 to the computer system 200. In the embodiment of FIG. 2, it may be desired to connect the power supply latch 202 to the computer system 200 rather than using the bracket 100 for cable routing. However, because the bracket 100 is not removable, there is no option to remove the bracket 100 from the inner rail 102.

Accordingly, there is a need for cable arm brackets that are removable from computer systems.

SUMMARY

According to one embodiment of the present disclosure, a cable arm bracket is disclosed that includes a body having a first end and a second end, generally opposite from the first end. The cable arm bracket further includes a cable guide attached to the first end of the body. The cable arm bracket further includes at least two apertures in the second end of the body. The cable arm bracket also includes a spring sheet connected to the body having a first end and a second end. The second end is generally opposite from the first end and over the second end of the body. The spring sheet has a ridge at the second end that obstructs at least part of at least one aperture of the at least two apertures with the spring sheet in a first position. The spring sheet is configured to bias into a second position so that the ridge does not obstruct the at least part of the at least one aperture.

According to aspects of the embodiment, the spring sheet is configured to bias into the second position when the first end of the spring sheet is moved towards the body. According to additional aspects, the spring sheet has a fulcrum point that contacts the body, and that converts a first movement of the first end of the spring sheet towards the body into a second movement of the second end of the spring sheet away from the body. Still further aspects include each aperture of the at least two apertures, including a large aperture portion merged with a small aperture portion. Additional aspects include the at least part of the at least one aperture being the large aperture portion. Further aspects include the spring sheet having a tab that secures the spring sheet to the body, and provides a spring force that causes the spring sheet to return to the first position. Yet additional aspects include the ridge obstructing at least part of the at least two apertures with the spring sheet in the first position.

According to another embodiment, a cable arm bracket system is disclosed that includes an inner rail of a computer system and a cable arm bracket. The inner rail has two projections. The cable arm bracket has a body with a first end and a second end, generally opposite from the first end. The cable arm bracket further has a cable guide attached to the first end of the body. Two apertures are formed in the second end of the body, and configured so that each projection of the two projections can extend through a respective aperture of the two apertures. The cable arm bracket further has a spring sheet connected to the body. The spring sheet has a first end and a second end. The second end is generally opposite from the first end and over the second end of the body. The spring sheet also has a ridge at the second end. The ridge is configured to at least partially obstruct the two projections from being removed from the two apertures with the cable arm bracket mated to the inner rail and the spring sheet in a first position. The ridge is configured further to permit removal of the two projections from the two apertures with the cable arm bracket mated to the inner rail and the spring sheet in a second position.

According to aspects of the embodiment, each aperture of the two apertures includes a large aperture portion merged with a small aperture portion. The two projections are retained in the small aperture portions with the cable arm bracket mated to the inner rail and the spring sheet in the first position. According to further aspects, the cable arm bracket is configured to slide relative to the inner rail between a first bracket position, with the two projections retained within the small aperture portions and a second bracket position, with the two projections retained in the large aperture portions. According to further aspects, the small aperture portions are sized to at least partially obstruct the two projections from being removed from the two apertures with the cable arm bracket within the first bracket position. Further aspects include the two projections being T-pins. Yet additional aspects include the two apertures being holes through the body. Additional aspects include the large aperture portions being sized to permit withdrawal of the two projections from the two apertures with the cable arm bracket in the second bracket position.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims.

BRIEF DESCRIPTION OF THE DRAWINGS

The disclosure, and its advantages and drawings, will be better understood from the following description of exemplary embodiments together with reference to the accompanying drawings. These drawings depict only exemplary embodiments and are, therefore, not to be considered as limitations on the scope of the various embodiments or claims.

DETAILED DESCRIPTION

Figure 1:
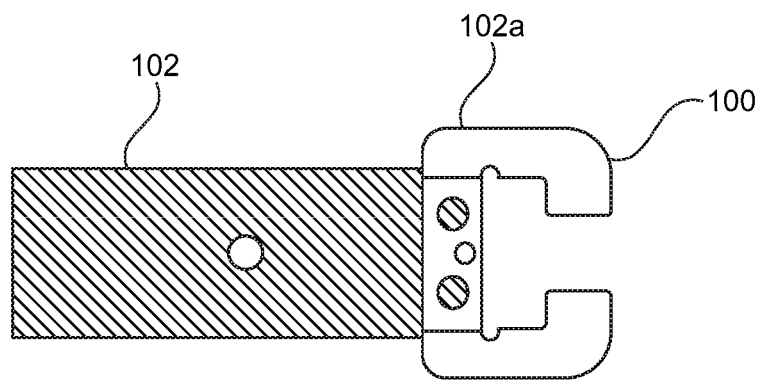
FIG. 1 illustrates a conventional cable arm bracket.
Figure 2:
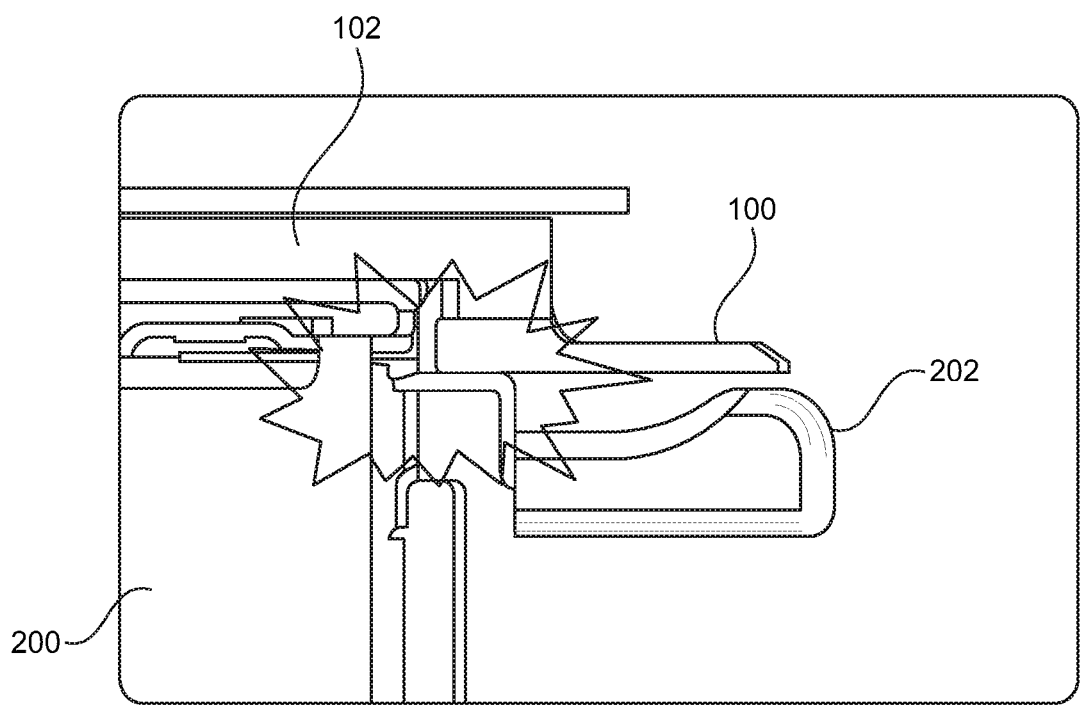
FIG. 2 illustrates a portion of a computer system that includes the conventional cable arm bracket of FIG. 1.

The various embodiments are described with reference to the attached figures, where like reference numerals are used throughout the figures to designate similar or equivalent elements. The figures are not drawn to scale, and they are provided merely to illustrate the instant invention. It should be understood that numerous specific details, relationships, and methods are set forth to provide a full understanding. One having ordinary skill in the relevant art, however, will readily recognize that the various embodiments can be practiced without one or more of the specific details, or with other methods. In other instances, well-known structures or operations are not shown in detail to avoid obscuring certain aspects of the various embodiments. The various embodiments are not limited by the illustrated ordering of acts or events, as some acts may occur in different orders and/or concurrently with other acts or events. Furthermore, not all illustrated acts or events are required to implement a methodology in accordance with the present invention.

Elements and limitations that are disclosed, for example, in the Abstract, Summary, and Detailed Description sections, but not explicitly set forth in the claims, should not be incorporated into the claims, singly, or collectively, by implication, inference, or otherwise. For purposes of the present detailed description, unless specifically disclaimed, the singular includes the plural and vice versa. The word "including" means "including without limitation." Moreover, words of approximation, such as "about," "almost," "substantially," "approximately," and the like, can be used herein to mean "at," "near," or "nearly at," or "within 3-5% of," or "within acceptable manufacturing tolerances," or any logical combination thereof, for example.

With regards to the present disclosure, the terms "computing device" or "computing system" or "computer system" refer to any electronically-powered or battery-powered equipment that has hardware, software, and/or firmware components, where the software and/or firmware components can be configured for operating features on the device. The term "operating environment" can refer to any operating system or environment that functions to allow software to run on a computer system.

The present disclosure describes cable arm brackets that can be removed from computer systems. The brackets of the present disclosure can be coupled to computer systems when needed for cable management, and can be removed from computer systems when not needed. This allows more space to be available within computer systems as needed. The brackets can be locked and unlocked from inner rails of the computer systems without needing a tool. The ability to remove the bracket without a tool provides for greater flexibility in cable management over conventional cable arm brackets.

Figure 3A:
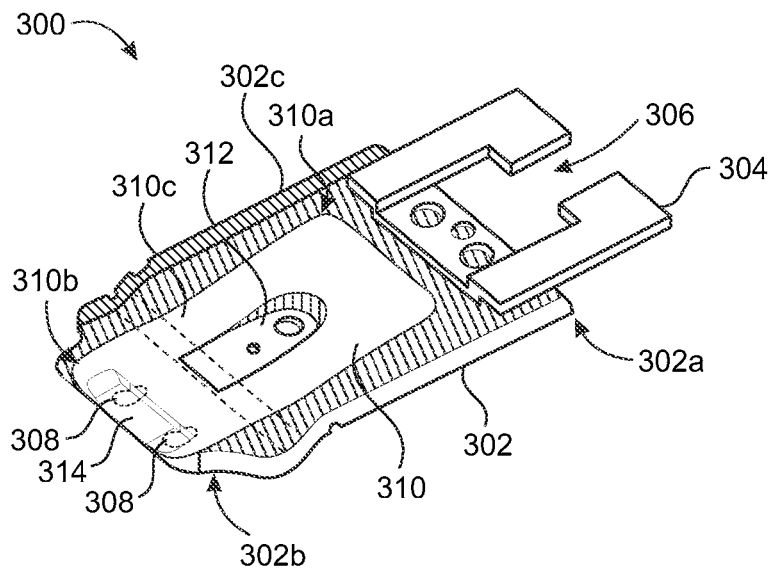
FIG. 3A illustrates a perspective view of a removable cable arm bracket, according to an embodiment of the present disclosure.

FIG. 3A illustrates a perspective view of a removable cable arm bracket 300, according to an embodiment of the present disclosure. The bracket 300 can be used for cable management, such as cable routing, in computer systems. The bracket 300 includes a body 302. The body 302 can be formed of one or more materials used for computer system components, such as one or more plastics and/or one or more metals. The body 302 can be sized similar to conventional cable arm brackets. Alternatively, the body 302 can be larger, such as longer, than conventional cable arm brackets. Because the bracket 300 is removable, the body 302 can come in different lengths for different length requirements in computer systems.

Extending from a first end 302a of the body 302 is a cable guide 304. In one or more embodiments, the cable guide 304 defines a generally T-shaped area 306 that is configured to accept and retain cables for a computer system. Although the cable guide 304 generally forms a C-shaped structure, or structures for the cable guide 304 can be used and the disclosed structure is not meant to be limiting.

At the second end 302b of the body 302, generally opposite from the first end 302a, are apertures 308. The apertures 308 are generally configured to interface with projections on an inner rail to secure the bracket 300 to the inner rail, as described further below. Although two apertures 308 are illustrated, there can be more than two apertures 308 depending on the size of the bracket 300.

In one or more embodiments, the body 302 can include raised sides 302c. The raised sides 302c can be along the entire perimeter of the body 302, or can be along the perimeter of the body 302 except for at the second end 302b.

Referring back to the apertures 308 and to FIG. 3B, illustrated is a bottom view of the bracket 300 that further shows the apertures 308, according to an embodiment of the present disclosure. As will be described in greater detail below with respect to FIGS. 4-6, the apertures 308 allow the bracket 300 to be removably secured to an inner rail (e.g., inner rail 102 of FIG. 1). In one or more embodiments, the apertures 308 have a profile generally of two aperture portions 308a and 308b joined together, as illustrated in the expanded view of FIG. 3B. The second aperture portion 308b is larger than the first aperture portion 308a. More specifically, the second aperture portion 308b is sized so that a projection on an inner rail can fit through the second aperture portion 308b. The first aperture 308a is sized so that at least a portion of the projection cannot fit through the first aperture portion 308a.

Figure 4:
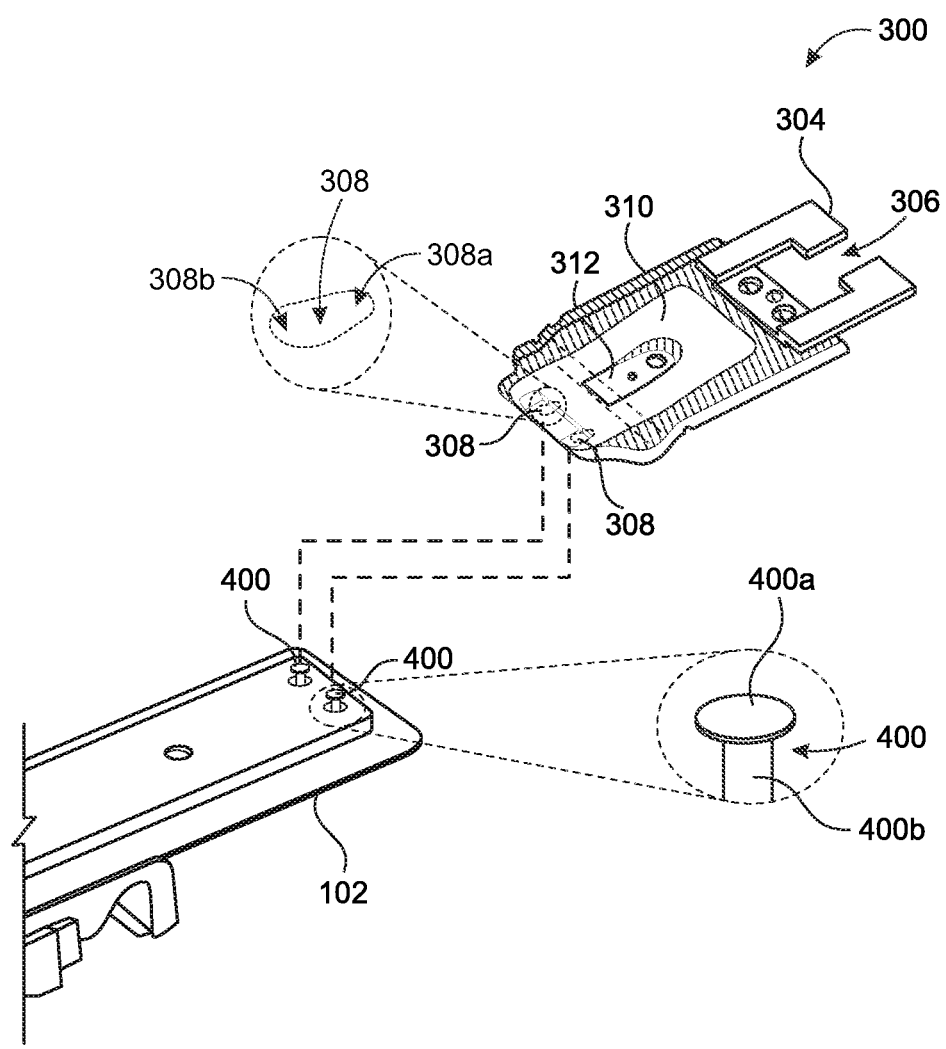
FIG. 4 illustrates mating the removable cable arm bracket of FIG. 3 to an inner rail of a computer system, according to an embodiment of the present disclosure.

Although illustrated generally as circular holes through and surrounded by the body 302, the apertures 308 in one or more embodiments can instead be slots that extend to the edge of the body 302, such that the slots are open at the second end 302b of the body 302. With the apertures 308 configured instead as open-ended slots, the method of mating the bracket 300 to an inner rail may vary slightly. For example, instead of the bracket 300 being vertically mated with an inner rail (as shown in FIG. 4), the bracket 300 may instead be horizontally mated with the inner rail. However, the method of securing or locking the bracket 300 to the inner rail can remain the same.

Figure 3B:
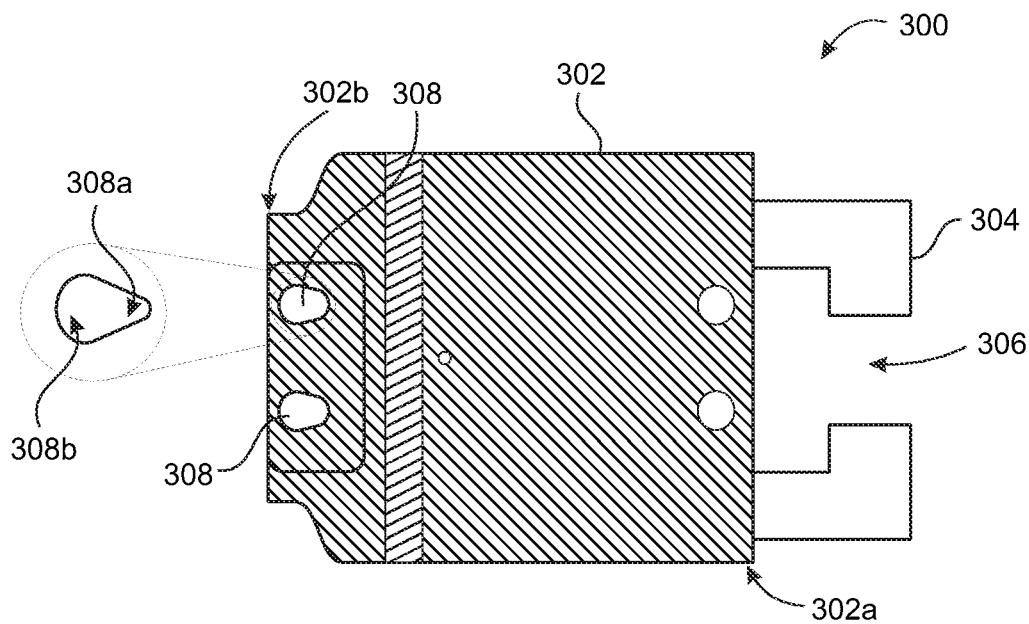
FIG. 3B illustrates a bottom view of the removable cable arm bracket of FIG. 3A, according to an embodiment of the present disclosure.
Figure 3C:
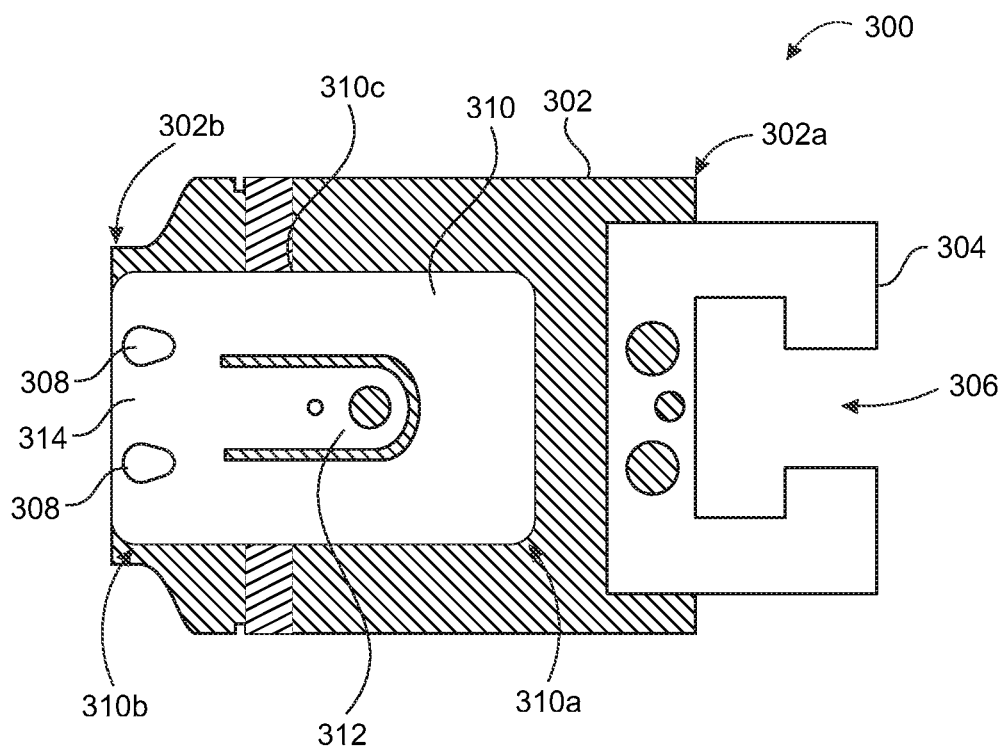
FIG. 3C illustrates a top view of the removable cable arm bracket of FIG. 3A, according to an embodiment of the present disclosure.

Referring back to FIG. 3A, and also as illustrated in the top view of the bracket 300 in FIG. 3C, the bracket 300 further includes a spring sheet 310. A first end 310a of the spring sheet 310 extends up off the body 302 when the spring sheet 310 is in an at rest position (e.g., no externally applied load) in a first position. A second end 310b of the spring sheet 310, generally opposite from the first end 310a, extends generally horizontally from a point 310c where the spring sheet 310 contacts the body 302 in the first position. The spring sheet 310 further includes a tab 312 that secures spring sheet 310 to the body 302. The tab 312 also generates a biasing force within the spring sheet 310 to return the spring sheet 310 to the first position illustrated in FIGS. 3A-3D, after a force is removed from the spring sheet 310.

Figure 3D:
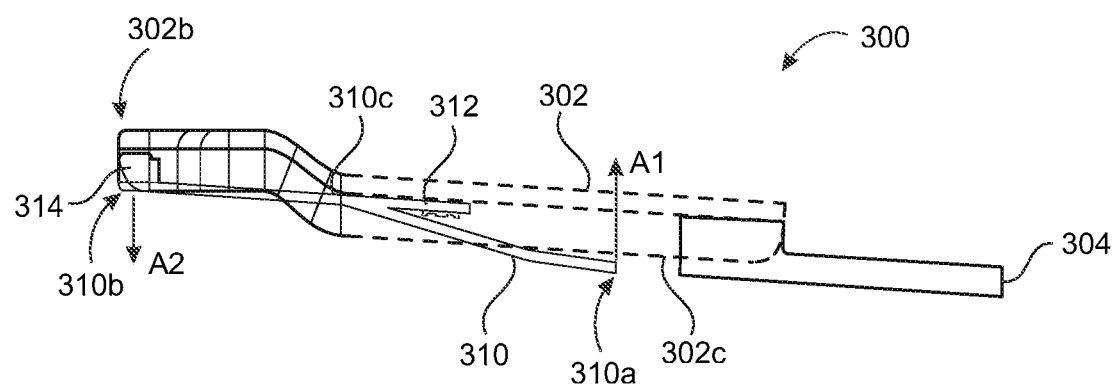
FIG. 3D illustrates a side view of the removable cable arm bracket of FIG. 3A, according to an embodiment of the present disclosure.

FIG. 3D is a side view of the bracket 300, according to an embodiment of the present disclosure, with the body 302 translucent to better show the spring sheet 310. At the second end 310b of the spring sheet 310 is a ridge 314. The ridge 314 is partially aligned with and configured to partially obstruct the apertures 308 (in FIG. 3C) with the spring sheet 310 in the first position. More specifically, the ridge 314 blocks the second aperture portions 308b of the apertures 308 when the spring sheet 310 is in the first position. Accordingly, and as will be described more in reference to FIGS. 4-6C below, the ridge 314 locks projections of the inner rail within the apertures 308 with the spring sheet 310 in the first position.

As described above, the first end 310a of the spring sheet 310 meets the second end 310b of the spring sheet 310 at the point 310c, which acts as a fulcrum. Pressing the first end 310a towards the body 302 in the direction of arrow A1 causes the second end 310b to move away from the body 302 in the direction of arrow A2. The second end 310b moving away from the body 302 causes the ridge 314 to also move away from the body 302, which positions the ridge 314 so that it no longer partially obstructs the apertures 308.

Referring to FIG. 4, illustrated is a vertical motion of mating the bracket 300 with an inner rail 102, according to an embodiment of the present disclosure. The inner rail 102 includes two projections 400. More specifically, the projections 400 are T-pins, as illustrated in the expanded view. Each T-pin 400 has a head 400a that is wider than a shaft 400b to assist in securing the bracket 300 to the inner rail 102. Specifically, the second aperture portions 308b (FIG. 3B) of the apertures 308 and the heads 400a of the T-pins 400 are sized so that the heads 400a of the T-pins 400 can extend through the second aperture portions 308b. Further, the first aperture portions 308a of the apertures 308 and the heads 400a of the T-pins 400 are sized so that the heads 400a cannot fit through the first aperture portions 308a (FIG. 3B). The shafts 400b of the T-pins 400 are sized so that the shafts 400b can fit within the first aperture portions 308a. The shapes and sizes of the apertures 308 and the T-pins 400 assists in securing the T-pins 400 within the apertures 308, and the bracket 300 to the inner rail 102. As shown by the dashed lines, the apertures 308 of the bracket 300 align with the T-pins 400. The bracket 300 is then vertically brought into contact with the inner rail 102 so that the T-pins 400 extend up into the apertures 308.

Although illustrated and described as being a T-pin, the projections 400 can be various other projections, such as L-pins, nails, screws, bolts, etc. Further, for embodiments where the apertures 308 are instead slots, the bracket 300 may instead be horizontally brought into contact with the inner rail 102 by sliding the projection 400 into the open ends of the slots. Further, the width of the slot may be larger than the diameters of the shafts 400b of the T-pins 400, and smaller than the diameters of the heads 400a of the T-pins 400, which assists in retaining the T-pins 400 in the slots.

Figure 5A:
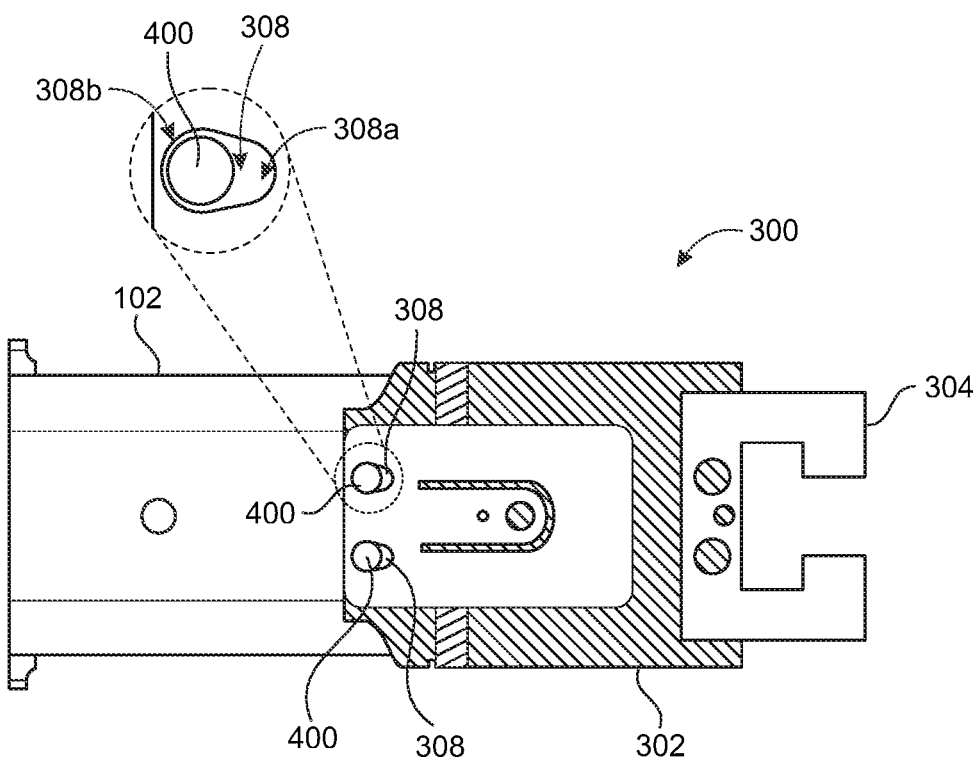
FIG. 5A illustrates a top view of one step for attaching the removable cable arm bracket of FIG. 3 to the inner rail of FIG. 4, according to an embodiment of the present disclosure.

FIGS. 5A-5D illustrate steps for securing the bracket 300 to the inner rail 102, according to an embodiment of the present disclosure. Referring to FIG. 5A, the bracket 300 begins after mating with the inner rail 102, as shown in FIG. 4. The T-pins 400 extend through the second aperture portions 308b (FIG. 3B) of the apertures 308 after the bracket 300 is mated with the inner rail 102.

Figure 5B:
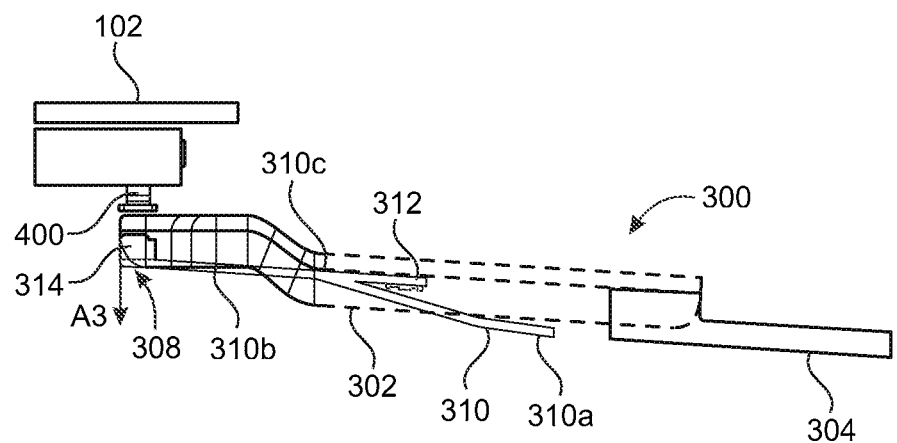
FIG. 5B illustrates a side view of a step of FIG. 5A for attaching the removable cable arm bracket of FIG. 3 to the inner rail of FIG. 4, according to an embodiment of the present disclosure.

Referring to FIG. 5B, the T-pins 400 extend through the apertures 308 and the tops of the heads 400a abut against the ridge 314. Thus, the T-pins 400 cause the ridge 314 and the second end 310b of the spring sheet 310 to bias relative to the body 302, in the direction of arrow A3 from the first position and into a second position. The second position of the spring sheet 310 causes the ridge 314 to not obstruct the apertures 308.

Figure 5C:
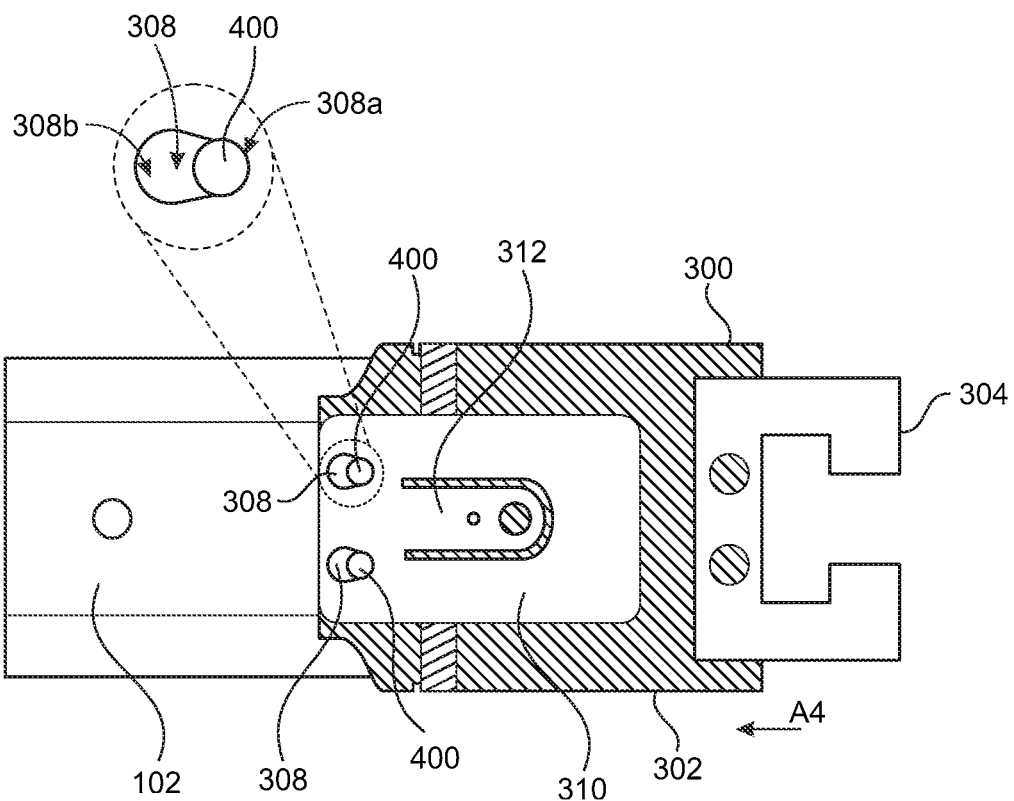
FIG. 5C illustrates a top view of a step for attaching the removable cable arm bracket of FIG. 3 to the inner rail of FIG. 4, according to an embodiment of the present disclosure.
Figure 5D:
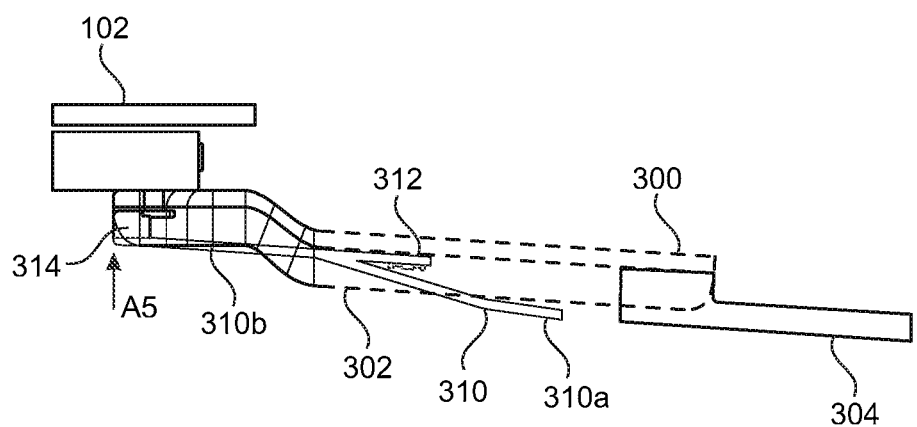
FIG. 5D illustrates a side view of a step for attaching the removable cable arm bracket of FIG. 3 to the inner rail of FIG. 4, according to an embodiment of the present disclosure.

Referring to FIG. 5C, the bracket 300 is then slid across the inner rail 102 in the direction of arrow A4. This causes the T-pins 400 to advance to the first circular apertures 308a within the apertures 308. At the same time, the tab 312 within the spring sheet 310 causes the second end 310b of the spring sheet 310 to bias towards the second end 302b of the body 302, as shown by the arrow A5 in FIG. 5D. The biasing action of the second end 310b of the spring sheet 310 causes the ridge 314 to contact the body 302 and lock the T-pin 400 within the aperture 308. The T-pin 400, being in the first circular aperture 308a within the ridge 314 on the opposite side of the ridge 314, generally locks the T-pin 400 to the bracket 300, and consequently the bracket 300 to the inner rail 102.

Figure 6A:
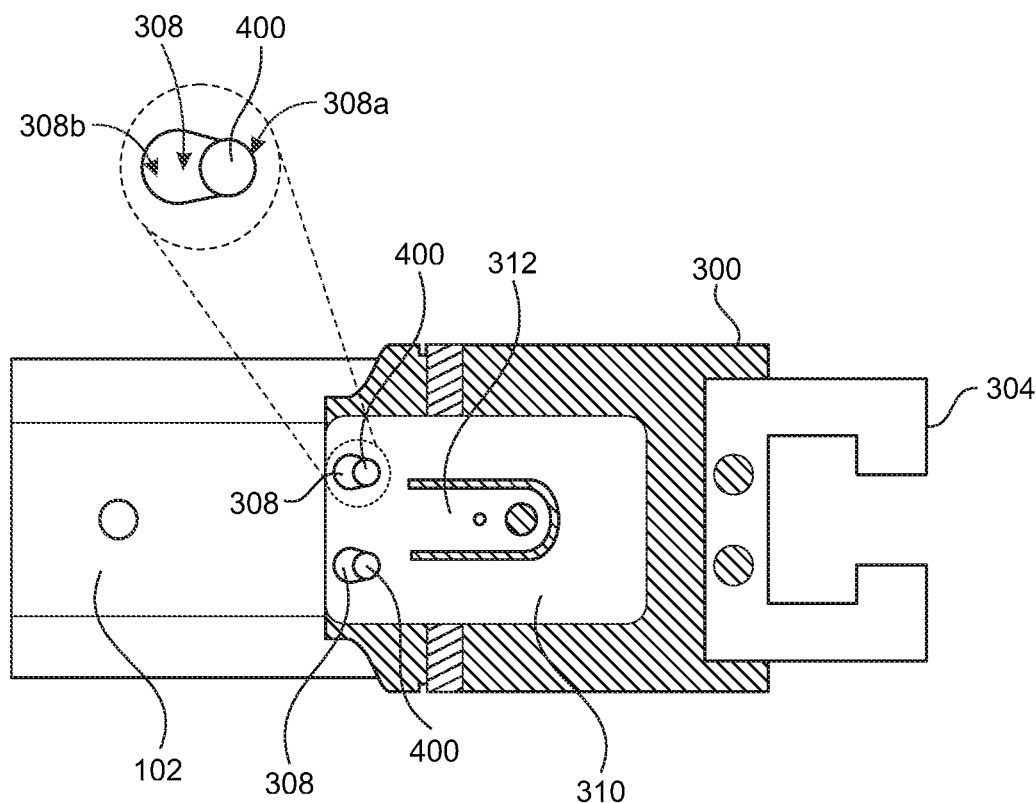
FIG. 6A illustrates a top view of a step for removing the removable cable arm bracket of FIG. 3 from the inner rail of FIG. 4, according to an embodiment of the present disclosure.
Figure 6B:
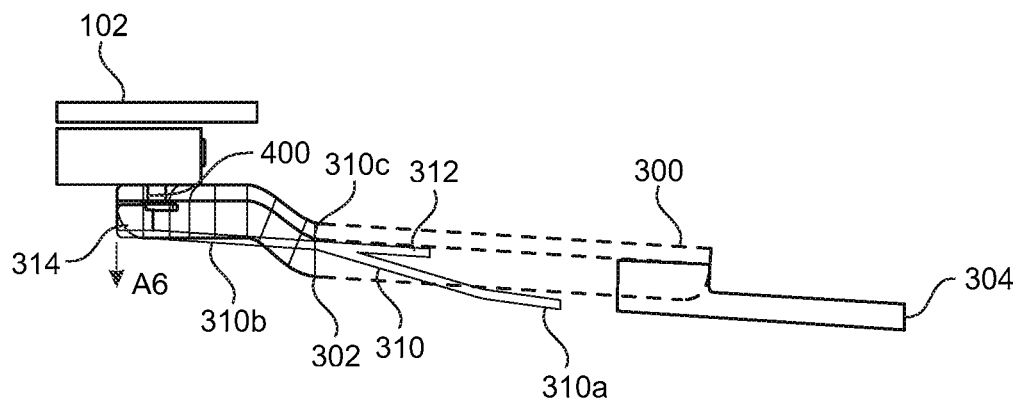
FIG. 6B illustrates a side view of a step for removing the removable cable arm bracket of FIG. 3 from the inner rail of FIG. 4, according to an embodiment of the present disclosure.
Figure 6C:
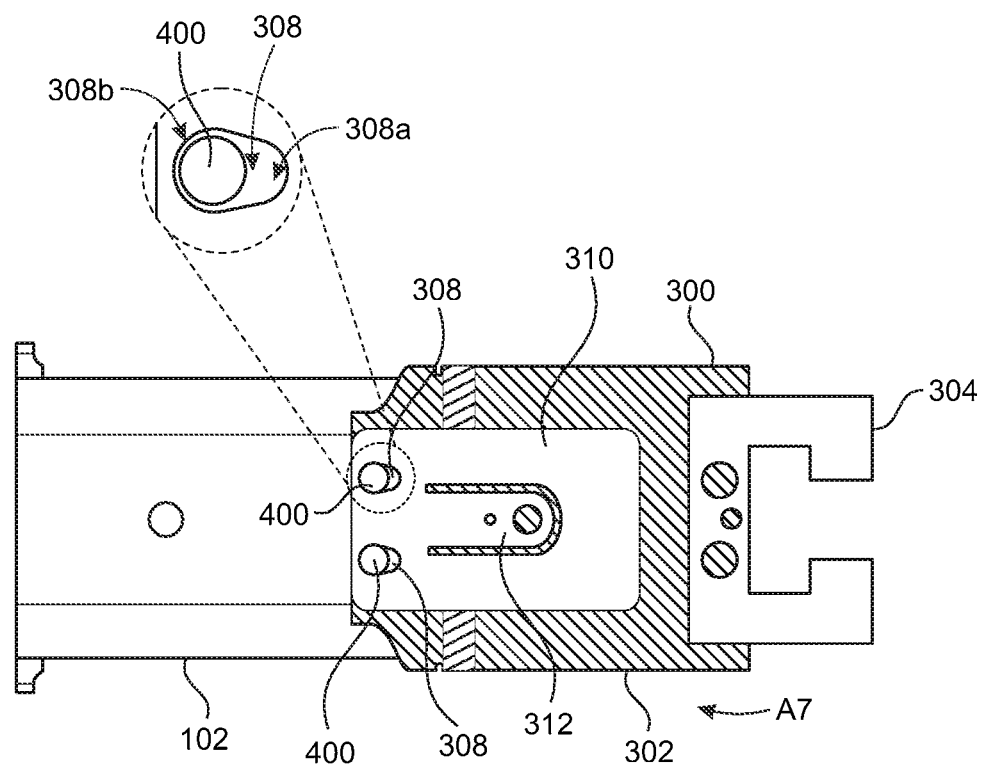
FIG. 6C illustrates a top view of a step for removing the removable cable arm bracket of FIG. 3 from the inner rail of FIG. 4, according to an embodiment of the present disclosure.

FIGS. 6A-6C illustrate steps for removing the bracket 300 from the inner rail 102, according to an embodiment of the present disclosure. The steps illustrated in FIGS. 6A-6C are generally the opposite of the steps illustrated in FIGS. 5A-5D. Referring to FIG. 6A, the bracket 300 is initially attached to the inner rail 102, as shown in FIG. 5C, with the bracket 300 in a first bracket position relative to the inner rail 102. The T-pin 400 is in the first aperture portion 308a, and the ridge 314 is on the opposite side, generally locking the T-pin 400 to the bracket 300.

Referring to FIG. 6B, a force is applied to the end 310a of the spring sheet 310 in the direction of arrow A5. An opposite force is generated on the end 310b of the spring sheet 310 in the direction of arrow A6, which causes the spring sheet 310 to bias from the first position to the second position. Specifically, the second end 310b of the spring sheet 310 extends away from the second end 302b of the body 302. This action releases the ridge 314 from locking the T-pin 400 against the first circular aperture 308a (FIG. 3B), such that the ridge 314 no longer obstructs the T-pin 400.

Referring to FIG. 6C, the bracket 300 can then be slid in the direction of arrow A7 across the inner rail 102 from the first bracket position to the second bracket position. This causes the T-pins 400 to advance to the second circular apertures 308b within the apertures 308. The bracket 300 can then be removed from the inner rail 102 by lifting it off in generally an opposite direction, as the vertical direction illustrated in FIG. 4. The T-pins 400 are withdrawn from the apertures 308 through the second aperture portions 308b.

The cable arm brackets of the present disclosure have benefits over conventional cable arm bracket by being removable. Accordingly, the brackets of the present disclosure can be coupled to computer systems when needed for cable management, and can be removed from computer systems when not needed. This allows more space to be available within computer systems as needed. The brackets also require the same space within computer systems as conventional brackets and also do not need a tool for installation or removal. Alternatively, because the brackets of the present disclosure are removable, different sized brackets can be used depending on the space requirements and needs within the computer systems.

While various embodiments of the present invention have been described above, it should be understood that they have been presented by way of example only, and not limitation. Numerous changes to the disclosed embodiments can be made in accordance with the disclosure herein without departing from the spirit or scope. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations, and modifications will occur to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

The terminology used herein is for the purpose of describing particular embodiments only and is not intended to be limiting. As used herein, the singular forms "a," "an," and "the" are intended to include the plural forms as well, unless the context clearly indicates otherwise. Furthermore, to the extent that the terms "including," "includes," "having," "has," "with," or variants thereof are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art to which this invention belongs. Furthermore, terms, such as those defined in commonly used dictionaries, should be interpreted as having a meaning that is consistent with their meaning in the context of the relevant art and will not be interpreted in an idealized or overly formal sense unless expressly so defined herein.

What is claimed is:

1. A cable arm bracket comprising:
 a body having a first end and a second end, generally opposite from the first end;
 a cable guide attached to the first end of the body;
 at least two apertures in the second end of the body; and
 a spring sheet connected to the body having a first end and a second end, generally opposite from the first end and over the second end of the body, the spring sheet having a ridge at the second end that obstructs at least part of at least one aperture of the at least two apertures with the spring sheet in a first position,
 wherein the spring sheet is configured to bias into a second position so that the ridge does not obstruct the at least part of the at least one aperture.

2. The cable arm bracket of claim 1, wherein the spring sheet is configured to bias into the second position when the first end of the spring sheet is moved towards the body.

3. The cable arm bracket of claim 2, wherein the spring sheet has a fulcrum point that contacts the body and that converts a first movement of the first end of the spring sheet towards the body into a second movement of the second end of the spring sheet away from the body.

4. The cable arm bracket of claim 1, wherein each aperture of the at least two apertures includes a large aperture portion merged with a small aperture portion.

5. The cable arm bracket of claim 4, wherein the at least part of the at least one aperture is the large aperture portion.

6. The cable arm bracket of claim 1, wherein the spring sheet includes a tab that secures the spring sheet to the body and provides a spring force that causes the spring sheet to return to the first position.

7. The cable arm bracket of claim 1, wherein the ridge obstructs at least part of the at least two apertures with the spring sheet in the first position.

8. A cable arm bracket system comprising:
 an inner rail of a computer system having two projections; and
 a cable arm bracket having:
  a body with a first end and a second end, generally opposite from the first end;
  a cable guide attached to the first end of the body;
  two apertures in the second end of the body configured so that each projection of the two projections can extend through a respective aperture of the two apertures; and
  a spring sheet connected to the body having a first end and a second end, generally opposite from the first end and over the second end of the body, the spring sheet having a ridge at the second end, wherein the ridge is configured to at least partially obstruct the two projections from being removed from the two apertures with the cable arm bracket mated to the inner rail and the spring sheet in a first position, and the ridge is configured to permit removal of the two projections from the two apertures with the cable arm bracket mated to the inner rail and the spring sheet in a second position.

9. The cable arm bracket system of claim 8, wherein each aperture of the two apertures includes a large aperture portion merged with a small aperture portion, and the two projections are retained in the small aperture portions with the cable arm bracket mated to the inner rail and the spring sheet in the first position.

10. The cable arm bracket system of claim 8, wherein the cable arm bracket is configured to slide relative to the inner rail between a first bracket position, with the two projections retained within the small aperture portions, and a second bracket position, with the two projections retained in the large aperture portions.

11. The cable arm bracket system of claim 10, wherein the small aperture portions are sized to at least partially obstruct the two projections from being removed from the two apertures with the cable arm bracket within the first bracket position.

12. The cable arm bracket system of claim 11, wherein the two projections are T-pins.

13. The cable arm bracket system of claim 12, wherein the two apertures are holes through the body.

14. The cable arm bracket system of claim 10, wherein the large aperture portions are sized to permit withdrawal of the two projections from the two apertures with the cable arm bracket in the second bracket position.

* * * * *